(12) United States Patent
Liu et al.

(10) Patent No.: US 6,326,265 B1
(45) Date of Patent: Dec. 4, 2001

(54) DEVICE WITH EMBEDDED FLASH AND EEPROM MEMORIES

(75) Inventors: David K. Liu, Fremont; Ting-wah Wong, Cupertino, both of CA (US)

(73) Assignee: Programmable Silicon Solutions, Sunnyvale, CA (US)

( * ) Notice: Subject to any disclaimer, the term of this patent is extended or adjusted under 35 U.S.C. 154(b) by 0 days.

(21) Appl. No.: 09/713,883

(22) Filed: Nov. 16, 2000

Related U.S. Application Data

(60) Division of application No. 09/277,347, filed on Mar. 26, 1999, now Pat. No. 6,252,799, which is a continuation-in-part of application No. 09/200,211, filed on Nov. 25, 1998, now Pat. No. 5,979,214, which is a continuation-in-part of application No. 08/838,854, filed on Apr. 11, 1997, now Pat. No. 5,867,425.

(51) Int. Cl.$^7$ ................................................. H01L 21/336
(52) U.S. Cl. ........................ 438/257; 438/258; 438/263; 438/587
(58) Field of Search .................................. 438/257, 258, 438/263, 264, 587

(56) References Cited

U.S. PATENT DOCUMENTS 6,074,916 * 6/2000 Cappelleti .

* cited by examiner

Primary Examiner—Kevin M. Picardat
Assistant Examiner—D. M. Collins
(74) Attorney, Agent, or Firm—Trop, Pruner & Hu, P.C.

(57) ABSTRACT

An integrated circuit die include a first portion including logic circuits. A second portion of the die includes an EEPROM memory, and a third portion includes a FLASH memory.

9 Claims, 8 Drawing Sheets

DEVICE WITH EMBEDDED FLASH AND EEPROM MEMORIES

This application is a divisional of U.S. patent application No. 09/277,347 filed Mar. 26, 1999 now U.S. Pat. No. 6,252,799, which is a continuation-in-part of U.S. patent application Ser. No. 09/200,211, filed Nov. 25, 1998 now U.S. Pat. No. 5,979,214 which is a continuation-in-part of U.S. patent application Ser. No. 08/838,854, filed Apr. 11, 1997 now U.S. Pat. No. 5,867,425.

BACKGROUND

This invention relates generally to devices including embedded nonvolatile memories.

Nonvolatile memory cells are advantageous since they retain recorded information even when the power to the memory is turned off. There are several different types of non-volatile memories including erasable programmable read only memories (EPROMs), electrically erasable and programmable read only memories (EEPROMs) and flash EEPROM memories. EPROMs are erasable through light exposure but are electrically programmable by channel hot electron injection onto a floating gate. Conventional EEPROMs have the same programming functionality, but instead of being light erasable they can be erased and programmed by electron tunneling. Thus, information may be stored in these memories, retained when the power is off, and the memories may be erased for reprogramming, as necessary, using appropriate techniques. Flash EEPROMs may be block erased, typically giving them better read access times than regular EEPROMs.

Currently, flash memories have gained considerable popularity. For example, flash memories are often utilized to provide on-chip memory for microcontrollers, modems and SMART cards and the like where it is desirable to store codes that may need fast updating.

While flash memories and EEPROMs are closely related, in many instances flash memories are preferred because their smaller cell size means that they can be made more economically. However, flash memories and EEPROMs often have very similar cell attributes.

Nonvolatile memory cells differ in certain respects from the transistors that are generally utilized in electronic components called logic devices, such as microcontrollers, that work with the memory cells. Logic devices are formed of transistors that use a single gate electrode. Nonvolatile memories usually include two gate electrodes, known as the control and floating gate electrodes, situated one over the other. Because of this structural difference, nonvolatile memories and logic devices may be made by different processes. This may contribute to a substantial increase in process complexity and manufacturing cost.

Particularly with an EEPROM, the electrical programming of the cells normally requires substantial potentials to be applied to the cells. These potentials induce electron tunneling from an N+ region onto the floating gate. Additional complexity may arise from the need to provide substantially larger voltages to memory cells than are needed for normal transistor operation.

While the industry has come to accept the need for separate process technologies for logic and nonvolatile memories and while those in the industry have also come to appreciate that significant currents to program flash EEPROMs, there would be a substantial demand for a nonvolatile memory which was both electrically erasable and programmable without the need for special process technologies or for relatively higher programming voltages and higher currents.

Furthermore, with the conventional FLASH EEPROMs, the electrical programming of the cells normally requires high current to be applied to the cells. A very minute amount of this electron current becomes injected from the drain depletion region onto the floating gate. This means that the injection efficiency of such devices is low (e.g., $1 \times 10^{-9}$). The requirement of high current adds additional complexity because of the design of the high current pump operated at low voltage.

Conventionally, three approaches have been utilized to integrating FLASH and EEPROM onto a single integrated circuit die. One technique is to build both the EEPROM and FLASH devices using an appropriate process technologies to create the two different types of devices on the same die. However, this results in a dramatic increase in the number of process steps involved and therefore greatly increases the cost of the resulting device. Therefore, such techniques have not met with considerable acceptance in the industry.

Alternatively, a basic FLASH memory may be created and an additional FLASH portion may be adapted to emulate EEPROM memory. This normally involves building software into the FLASH memory so that the FLASH appears to operate as EEPROM memory. The software is stored in a boot block which is also a FLASH memory. Thus, the system needs a first FLASH memory to act as FLASH, a second FLASH memory to store the software needed to emulate EEPROM operation and additional FLASH memory to actually implement the FLASH-like capabilities. This results in a very costly structure whose operation is complicated. Thus, this technique has also not met with consideration administrative acceptance.

The third technique is to use an EEPROM memory to emulate a FLASH memory. However, EEPROM memories are generally large and therefore tend to be much more expensive. In fact, EEPROM memories may be three to four times larger than FLASH memories. Therefore, this approach is generally not considered to be commercially viable and has similarly failed to meet with considerable commercial acceptance.

Thus, there is a continuing need to find ways to build both EEPROM and FLASH capabilities into a single integrated circuit die. circuits, a second portion including an EEPROM memory and a third portion including a FLASH memory.

DESCRIPTION OF THE PREFERRED EMBODIMENT

Figure 1:
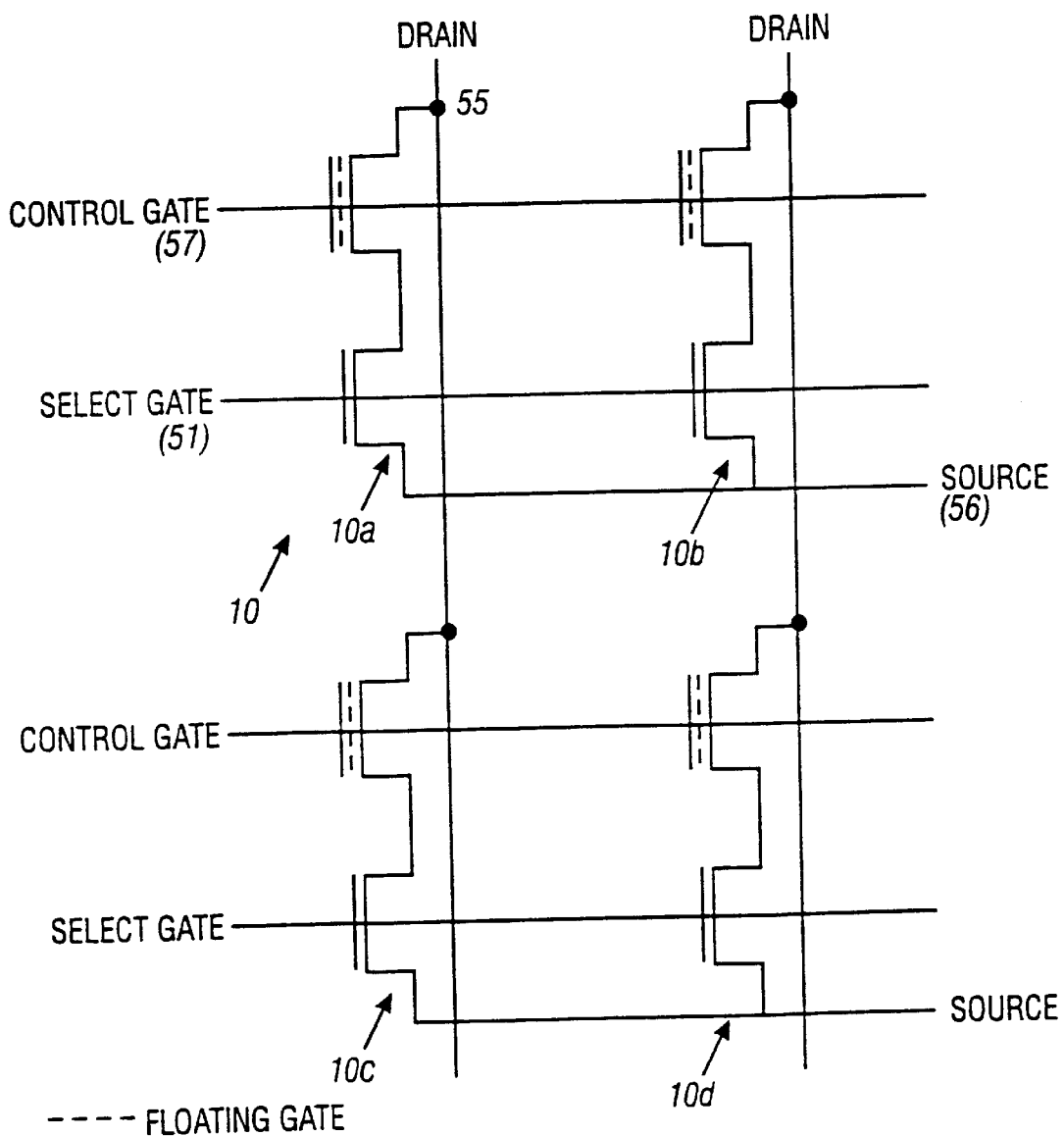
FIG. 1 is a schematic depiction of an array configuration for one embodiment.

A logic device 100 may be fabricated on a die that also includes embedded FLASH and EEPROM memories 100 and 102. In this way, the logic device and the two memory devices, made by the same process technology, can be integrated together in a compact form. In some embodiments this form has cost and speed advantages.

For example, the EEPROM memory 100 may be larger in cell size and may provide for byte erasing. The FLASH memory may be smaller in cell size and may be block erased. For example, the logic circuits might be, in one example, the logic circuits for a cellular telephone including a processor 106, shown in FIG. 5, which uses the EEPROM memory 102 to store telephone numbers that are frequently changed and the FLASH memory 104 to store protocols that are seldom changed.

Figure 5:
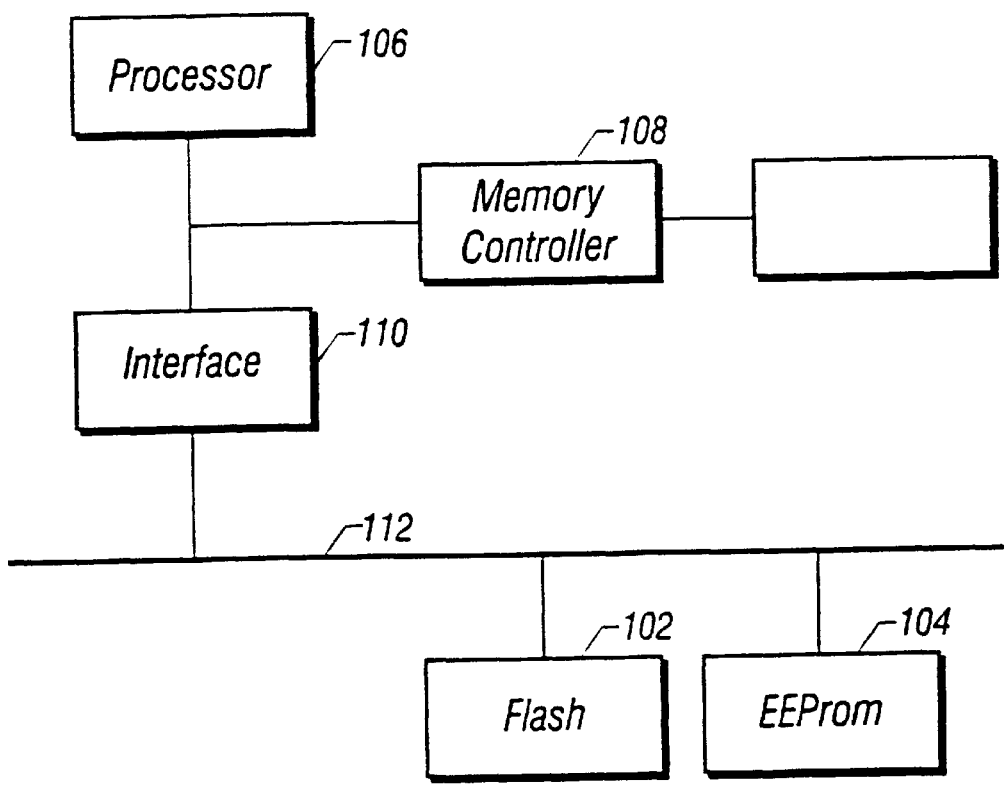
FIG. 5 is a block diagram of one embodiment of the present invention.

In one embodiment, shown in FIG. 5, the memories 102 and 104 may be coupled via a local bus 112 and interface 110 to the processor 106 and system memory controller 108. The controller 108 may control off-chip random access memory indicated in dashed lines.

An EEPROM memory cell 10, shown in FIG. 1, includes a sense transistor 12 and a select transistor 14. This structure is advantageously implemented on a semiconductor layer having situated thereon an electrically isolated floating gate 22.

For each cell 10a–10d, the source 13 of the select transistor 14 is controlled by the source node 56. The gate of the select transistor 11 is controlled by the node 51. The control gate 27 of the sense transistor 12 is controlled by the control node 57. The drain 16 of the sense transistor 12 is connected to the drain node 55.

Figure 2:
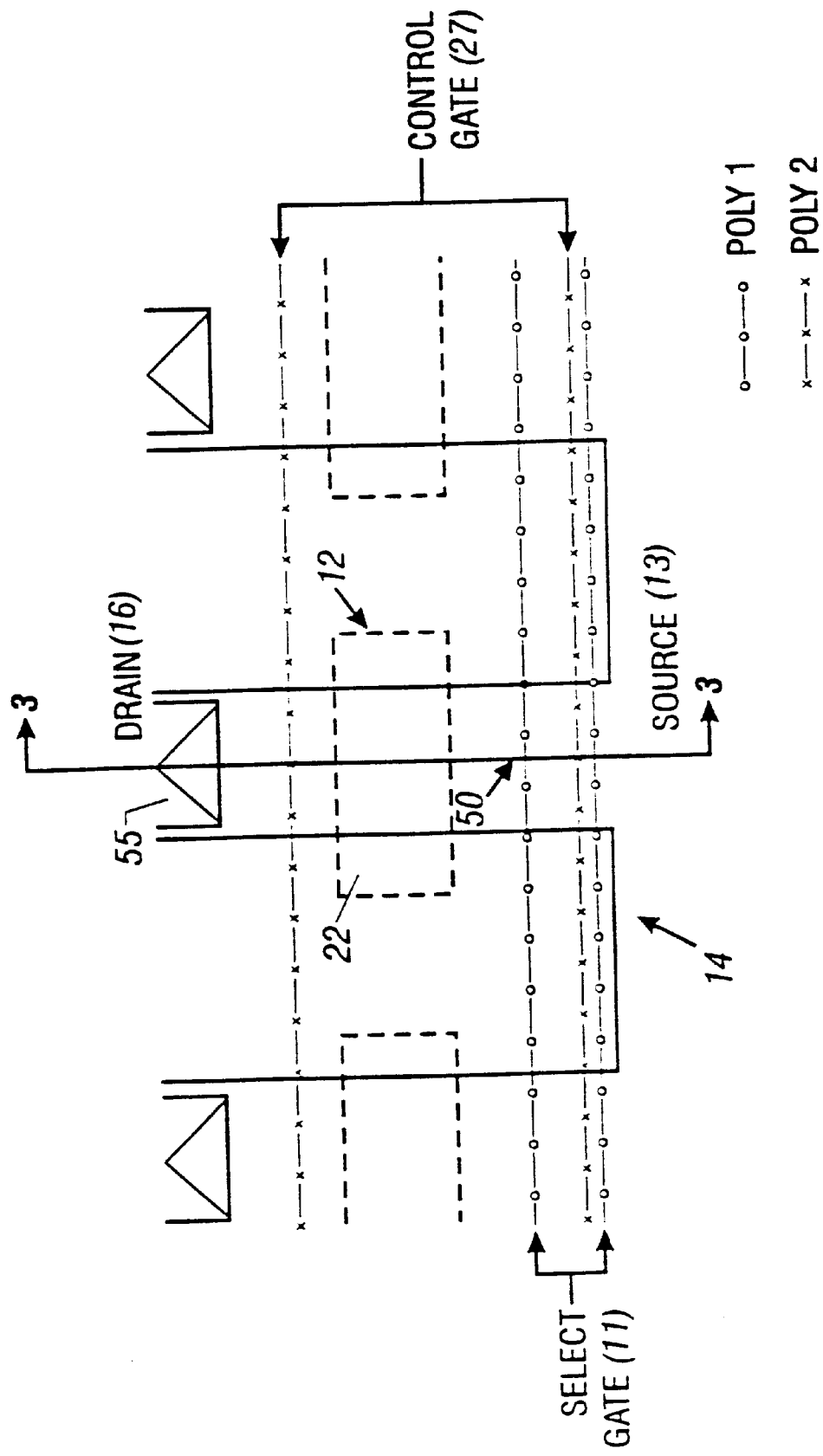
FIG. 2 is a greatly enlarged top plan view showing the layout of a semiconductor implementation of one cell of the embodiment shown in FIG. 1.

One layout for implementing a cell 10, shown in FIG. 2, includes the control gate 27. The control gate 27 extends across the active region 18 which is bordered by the drain 16 of the sense transistor 12 and the source 13 of the select transistor 14. The select gate 11 also extends parallel to and underneath the control gate 27, bordering the edge of the control gate 27 and the region 15a. The control gate 27 may be non-self-aligned to the select gate 11 and the sense gate 12. The floating gate 22 is also situated in isolation under the control gate 27, over the active region 18.

The drain 16 may include a contact 55 is illustrated in FIG. 2 which connects to the drain diffusion 16. The source node 56 may also be implemented by a contact.

Figure 3:
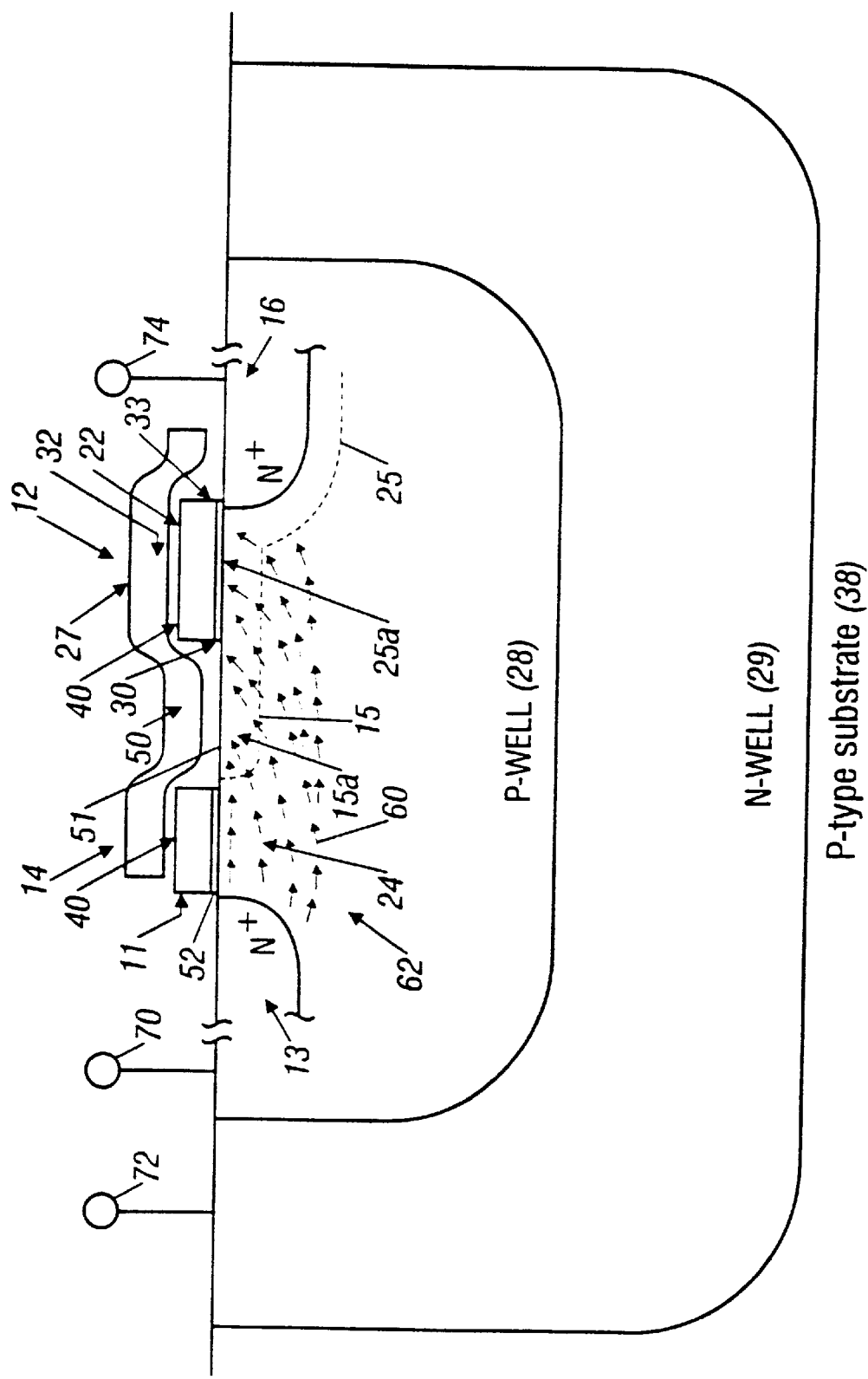
FIG. 3 is a cross-sectional view taken generally along the line 3—3 in FIG. 2.
Figure 4:
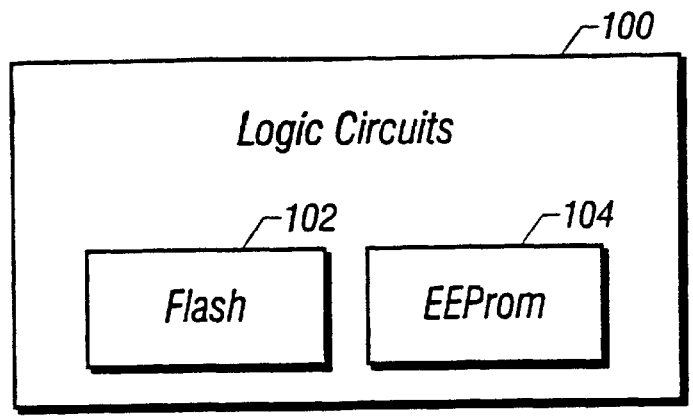
FIG. 4 is an enlarged top plan view of one embodiment of the present invention

The relationship of the sense transistor 12 and select transistor 14 is illustrated in FIG. 3. The floating gate 22 forms portions of the transistor which has a drain 16 and a source 13. Similarly, the select gate 11 forms the other portion of the transistor between the source 13 and the drain 16. The sense transistor 12 includes a channel 25a while the select transistor 14 includes a channel 24. The control gate forms the plate of the capacitor whose channel is 15a. The select gate 14, the floating gate 22 and the control gate 27 form the gates of a transistor with a source 13 and drain 16.

In the illustrated embodiment, the channels 24a and 24 are P-type semiconductor material and are part of a P-well 28. The P-well 28 in turn is formed in an N-well 29. Finally, the N-well 29 is formed in a P-type substrate 38. The P-well 28 may be biased, as indicated at 70, and the N-well 29 may be biased, as indicated at 72.

A capacitor 50 is formed where the control gate 27 overlays the substrate region 15a between the select gate 11 and the floating gate 22. It controls the depletion/inversion of the region 15a to create an extension of the depletion/inversion region 25 formed by the sense transistor 12. It is operated during programming and read operations. In read operation, the capacitor 50 bridges the sense and select transistor channels by forming an inverted region. When the inverted region, under region 15a is formed, the sense and select transistors 12 and 14 are connected.

The floating gate 22 forms the tunneling capacitor 33 by its interaction with the channel 25a. A tunnel oxide 30 separates the floating gate 22 from the channel 25a. Similarly the interpoly dielectric oxide 40, which is part of a coupling capacitor 32, separates the floating gate 22 from the control gate 27. Finally, the control gate 27 is separated by the oxide 51 from the region 15a. Likewise the select transistor 14 includes a gate oxide 52, which may be of the same thickness as the tunnel oxide 30.

The overlaying of the control gate 27 over the select gate 11 is for processing convenience. Similarly, the control gate 27 is shown as overlaying the drain 16, but this too is merely for processing convenience. The control gate 27 need not be self-aligned to the sense or select transistors.

The cell 10 may be described as an EEPROM utilizing high efficiency substrate hot electron injection for programming and Fowler-Nordheim tunneling for erasure. The process of substrate hot electron injection is well described in T. H. Ning, C. M. Osburn, and H. W. Yu "Emission Probability of Hot Electrons from Silicon into Silicon Dioxide," J. Appl. Phus., vol. 48, p, 286, (1977); Boaz Eitan, James L. McCreary, Daniel Amrany, Joseph Shappir, "Substrate Hot-electron Injection EPROM," IEEE Transactions on Electron Devices, Vol. Ed-31, No. 1, p. 934, (July 1984); I. C. Chen, C. Kaya, and J. Paterson, "Band-to-Band Tunneling Induced Substrate Hot-electron (BBISHE) Injection: A New Programming Mechanism for Nonvolatile Memory Devices," IEDM (1989) p. 263; and C. Y. Hu, D. L. Kencke, S. K. Benerjee, "Substrate-current-induced Hot Electron (SCIHE) Injection: A New Convergence Scheme for FLASH Memory," IEDM (1995), p. 283. Each of these articles is hereby expressly incorporated by reference herein.

Programming is achieved by high efficiency substrate hot electron injection. As indicated in FIG. 3, substrate electrons, indicated by the arrows at 60, are generated by forward biasing the source 13 which is separated from the sense transistor 12 channel 25a by the select transistor channel 24 and the region 15a under the capacitor 50. Some of the substrate electrons 60 diffuse through the region underneath the channel 24 to the channel region 25a underneath the sense transistor 12.

For cells that need to be programmed, the channel region 25a is biased such that a depletion region 25 is formed. The depletion region 25 is extended, as indicated at 15, by the operation of the capacitor 50, under the capacitor 50 as well. When an electron gets to the depletion region 25, it is accelerated by an electric field, Vcs. The electric field Vcs is the difference between the channel 25a potential (potential of the surface inversion region) and the P-well 28 potential. Some of these electrons gain sufficient energy, in excess of the effective oxide barrier height potential, to be injected onto the floating gate 22.

For cells that are not to be programmed, the channel-to-P-well potential is less than the effective oxide barrier height. In such a case, the electrons would not gain sufficient energy to overcome the barrier height and are not injected onto the floating gate 22.

The N+ doped region 13, the P-region 24 under the select transistor 14 and the sense transistor channel 25a, and the depletion region 15 under the capacitor 50 form a lateral bipolar transistor 62. The emitter (source 13) of the bipolar transistor 62 acts as a charge injector, injecting substrate electrons from the source diffusion to the biased depletion region under the floating gate 22. With the diffusion 13 as the emitter and the channel 24 as the base, the collector is the biased depletion region 25 (including the region 15). Since the channel region 25a acts as the channel for the sense transistor during read, and the biased depletion region 25 under the sense transistor 12 acts as the collector of the bipolar transistor 62 during programming, a compact cell layout is achieved.

The efficiency of substrate hot electron injection is a function of a number of characteristics. Considering the depletion region 25, electrons scatter with lattice phonon scattering across the depletion region 25 with a certain electron mean free path. Some of these electrons, without much scattering, gain sufficient energy to overcome the effective barrier height and are injected onto the floating gate 22. Some electrons gain less energy than the effective barrier height and are not injected onto the floating gate 22. The injection efficiency is a strong function of the doping concentrations and the channel-to-P-well potential, Vcs.

Since the cell 10 is situated in a P-well 28 embedded in an N-well 29, during programming the floating gate 22 is capacitively coupled to a higher voltage through the coupling capacitor 32 by raising the control gate 27 to Vpp, which may be from 7 to 14 volts. The voltage that the floating gate 22 attains at low drain bias is approximately a function of the voltage on the floating gate when the control gate 27 and the P-well 28 and drain 16 are at ground, plus the coupling ratio times the voltage on the control gate 27. The coupling ratio, to a first order, is approximately equal to the capacitance of the capacitor 32 divided by the sum of the capacitances of the coupling capacitor 32 and the tunneling capacitor 33.

When the select transistor 14 is off, the sense transistor drain 16 potential can be forced close to the supply potential Vcc or higher. Since the select transistor 14 is off, the potential of node 51 follows the channel 25a potential. The channel 25a potential, which is the potential of the surface inversion region of the channel region 25a, is set as follows. When the potential of the floating gate 22 (Vfg) is one sense transistor 12 threshold voltage higher than the drain 16 potential, the channel potential is the same as the drain potential. On the other hand, when the floating gate 22 potential is less than the drain 16 potential plus the sense transistor 12 threshold voltage, the channel potential is the difference between the floating gate 22 voltage and the sense transistor 12 threshold voltage.

The P-well potential is the voltage 70 applied to the P-well 28. Since the P-well 28 is embedded in an N-well 29, and the N-well is set at a voltage 72 approximately Vss or higher, the P-well potential Vp can be negative, typically negative one to negative two volts. Moreover, it is usually less than the effective oxide barrier height to avoid any potential disturb problem.

The potential difference between the channel 25a region and the P-well 28 potential (Vp) 70 is the voltage across the depletion region 25. For cells to be programmed, the drain 16 voltage is raised high, typically close to Vcc or higher. A depletion region 25 in the channels 25a and 24 underneath the sense transistor 12 and the capacitor 50 is formed with a voltage drop equal to the channel potential minus the P-well potential 70.

For those cells that are not to be programmed, the drain 16 voltage 74 is set to zero volts (Vss). The voltage drop across the depletion region 25 then is equal to the absolute value of Vp, which is typically less than the effective oxide barrier height.

Cell 10 erasure is achieved by Fowler-Nordheim tunneling of electrons from the floating gate 22 to the channel region 25a and the drain diffusion 16. During erasure, the control gate 27 is forced to a negative voltage from −7 to −14 volts, for example, As for the drain diffusion 16, the P-well 28, and the N-well 29, they are biased to a positive potential close to Vcc or higher. Vcc is determined by the particular technology utilized. For example, it could be 5.0 to 2.5 volts with present technologies. This reduces the electric field across the junction between the N+ diffusion 16 and the P-well 28. The reduced field prevents acceleration of hot hole trapping in the gate oxide under the floating gate 22. The drain 16 is preferably not biased to a voltage higher than the P-well 28 to such an extent that gate induced drain leakage (GIDL) becomes a problem. With current technologies, this means that the drain 16 bias cannot be higher than the P-well 28 bias by about one volt. In addition, if the drain 16 bias significantly exceeds the P-well 28 bias, hot hole trapping may occur in the select gate oxide 52 due to the lateral junction field acceleration.

The ability to apply a positive voltage to the P-well arises because the P-well 28 is embedded in an N-well 29. The P-well voltage is preferably equal to or less than N-well potential to avoid P-well/N-well forward biasing. Thus, applying a positive voltage of Vcc or higher to the P-well, N-well and the drain 16 can eliminate hot hole trapping induced by GIDL while allowing the drain 16 voltage to be raised to Vcc or higher.

The voltage across the capacitor 33 is the difference between the floating gate 22 potential on the one hand and the diffusion 16 and P-well 28 potentials. When the difference exceeds 8 and 10 volts, sufficient tunneling current is generated and the floating gate 22 can be erased to a negative potential in the time frame of a few milliseconds to a few seconds, depending on the tunneling oxide 30 thickness.

Electrons tunnel to the drain region 16 (drain erase). The tunneling current depends on the voltage from the floating gate 22 to the drain 16. In one embodiment of the invention, byte erasing is used.

Reading the programming state of the cell 10 may be accomplished as follows. The floating gate 22 is capacitively coupled to a higher potential by forcing the control gate 27 to a positive potential, for example, of 2.5 to 5 volts. The floating gate 22 is coupled to a potential Vfg which can be calculated as being equal to the sum of the floating gate potential when the control gate 27 is held at ground, plus the potential on the control gate 27 times the coupling ratio.

The drain 16 potential during ready is limited to a voltage of less than 2 volts. This is to avoid any read disturb.

For the selected cell to be read, the select gate 11 is forced to Vcc, and the source 13 is forced to ground. The unselected gate 11 is also forced to ground.

When these potentials are applied to the selected cell 10, a current flows through the sense transistor 12. This current is then fed to a current sense amplifier (not shown). If the voltage on the floating gate 22 is greater than the threshold voltage on the sense transistor 12, a higher current, perhaps greater than 20 microamps, is detected as the conducting state. When the potential of the floating gate is less than the threshold voltage, a lower current, for example of less than one microamp flows, and a nonconducting state is detected.

A detected conducting state can be called a one state. A nonconducting state can be called the zero state.

An example of the operation of the cell in programming, reading and erasing is summarized in the following chart:

| | Cell Operation | | | | | |
|---|---|---|---|---|---|---|
| | Erase | | Program | | Read | |
| | (Selected) | (Unselected) | (Selected) | (Unselected) | (Selected) | (Unselected) |
| Drain (55) | ≧Vcc | *0 or ≧ Vcc | ≧Vcc | *0 or ≧ Vcc | −1.5 V | *0 or −1.5 V |
| Source (56) | Float | Float | Vs | Float | Vss | Vss |
| Select (51) | Vss | Vss | Vss to Vs | Vss to Vs | Vcc | Vss |
| Control (57) | −7 to −14 V | Vss | Vpp | Vss | 2 to 5 V | Vss |
| N-well (29) | ≧Vcc | ≧Vcc | Vcc to Vss | Vcc to Vss | Vcc | Vcc |
| P-well (28) | ≧Vcc | ≧Vcc | Vbias | Vbias | Vss | Vss |

*0 is for unselected column.
Vpp = 7 to 14 volts.

Vs is the node voltage set by the injection current level, ranging from a few tens of nanoamps to a few tens of microamps depending on the programming speed requirement. Typically it would be from tens of milliseconds to tens of microseconds. Vbias is the bias on the P-well 28 which can be Vss or it can be forced to −1 to −2 volts to enhance injection efficiency.

A suitable on-chip circuit for generating two negative bias potentials, one to bias the control gate 57 and the other to negatively bias the P-well 28, can be found in L. A. Glasser and D. W. Dobberpuhl, :The Design and Analysis of VLSI Circuits," (December 1985), published by Addison-Wesley, at pages 301–329, hereby expressly incorporated by reference herein. Vss is the external ground potential.

While the cell 10 may be utilized as a single element, it can also be connected as an array as shown in FIG. 1. In the array, a plurality of cells 10, 10a, 10b, 10c, 10d are depicted. The source node 13 is formed by connecting all of the source nodes of cells in the same row as one single node 56. The control node 17 is formed by connecting all the control nodes of the individual cells in the same row together as a single node 57. The select gate node 11 is formed by connecting the select gate nodes for all the cells on the same row together as one node 51. Similarly, the drain node 16 is formed by connecting all the drain nodes for cells in the same column together as a single node 55. This node leads to the sense amplifier (not shown).

Figure 6:
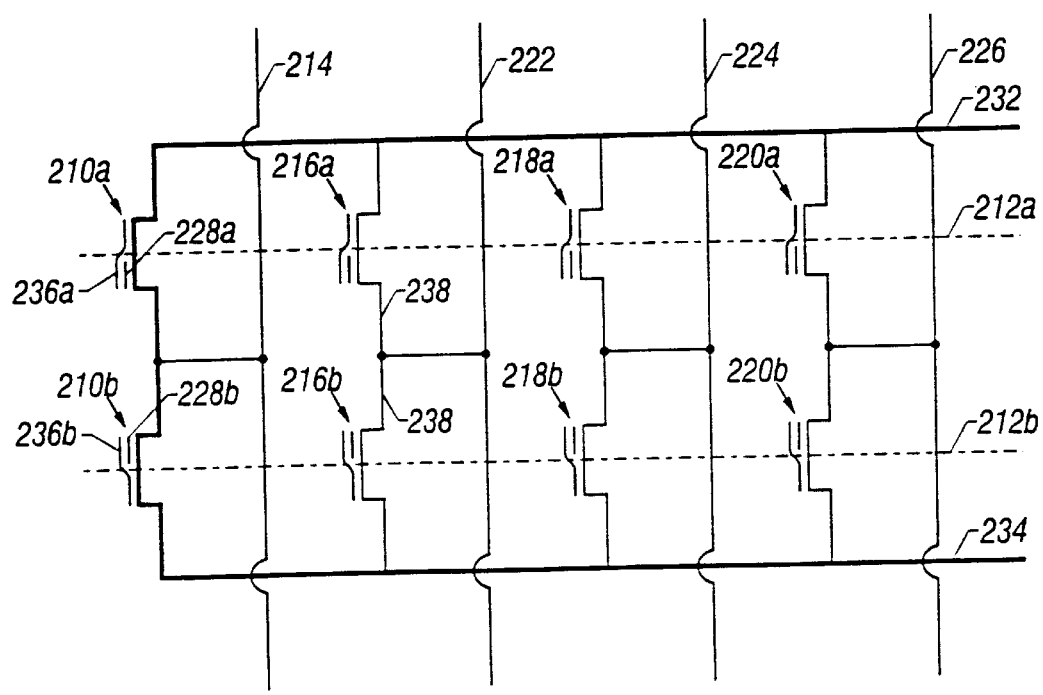
FIG. 6 is a schematic depiction of an array configuration for one embodiment.

A pair of FLASH memory cells 210a and 210b for the FLASH memory 102, shown in FIG. 6, are located in two adjacent word lines 212a and 212b. The cells 210 are both arranged on the same bit line 214. Other cells 216, 218, and 220 are arranged on bit lines 222, 224, and 226 and words lines 212. This structure is advantageously implemented on a semiconductor layer having situated thereon electrically isolated floating gates 228.

The source terminal 230 of each cell 210, 216, 218 and 220 is controlled by a source 232 or 234. The control gates 236a and 236b of the cells 210, 216, 218 and 220 are controlled by the word lines 212. The drains 238 of the cells are connected to the bit lines 214, 222, 224 and 226.

Figure 7:
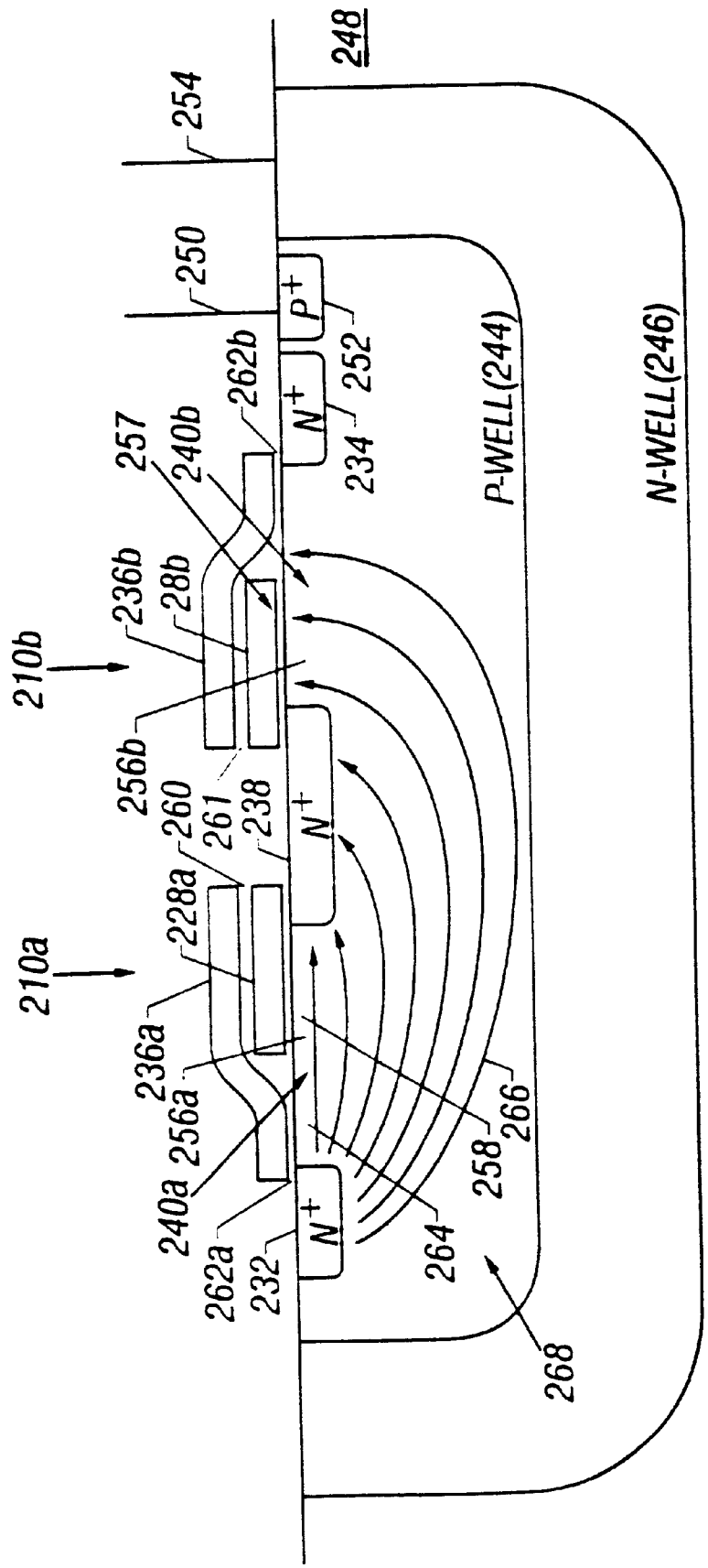
FIG. 7 is a cross-sectional view taken generally along the line 7—7 in FIG. 8.

One layout for implementing a pair of cells 210, shown in FIG. 7, includes a pair of control gates 236a and 236b. The same layout may be used for the other pairs of cells 216, 218, and 220. The control gates 36 extend across a field oxide isolation region 240 which is bordered by the drain 238 on one side and the source 232 and 234 on the other side. The floating gates 228a and 228b are situated in isolation under the control gates 236a and 238a, over the oxide isolation region 240.

In the illustrated embodiment, the active areas under the bit lines are P-type semiconductor material and are part of a P-well 244. The P-well 244 in turn is formed in an N-well 246. Finally, the N-well 246 is formed in a P-type substrate 248. The P-well 244 may be biased, as indicated at 250 through a heavily doped P-type contact 252, and the N-well 246 may be biased, as indicated at 254.

Each floating gate 228 forms a tunneling capacitor 257 by its interaction with the channel 258. A tunnel dielectric 256 separates the floating gate 228 from the channel 258. Similarly the interpoly dielectric 260 which is part of a coupling capacitor 261, separates the floating gate 228 from the control gate 236. Finally, the control gate 236 is separated by the dielectric 262 from the channel 264.

Figure 8:
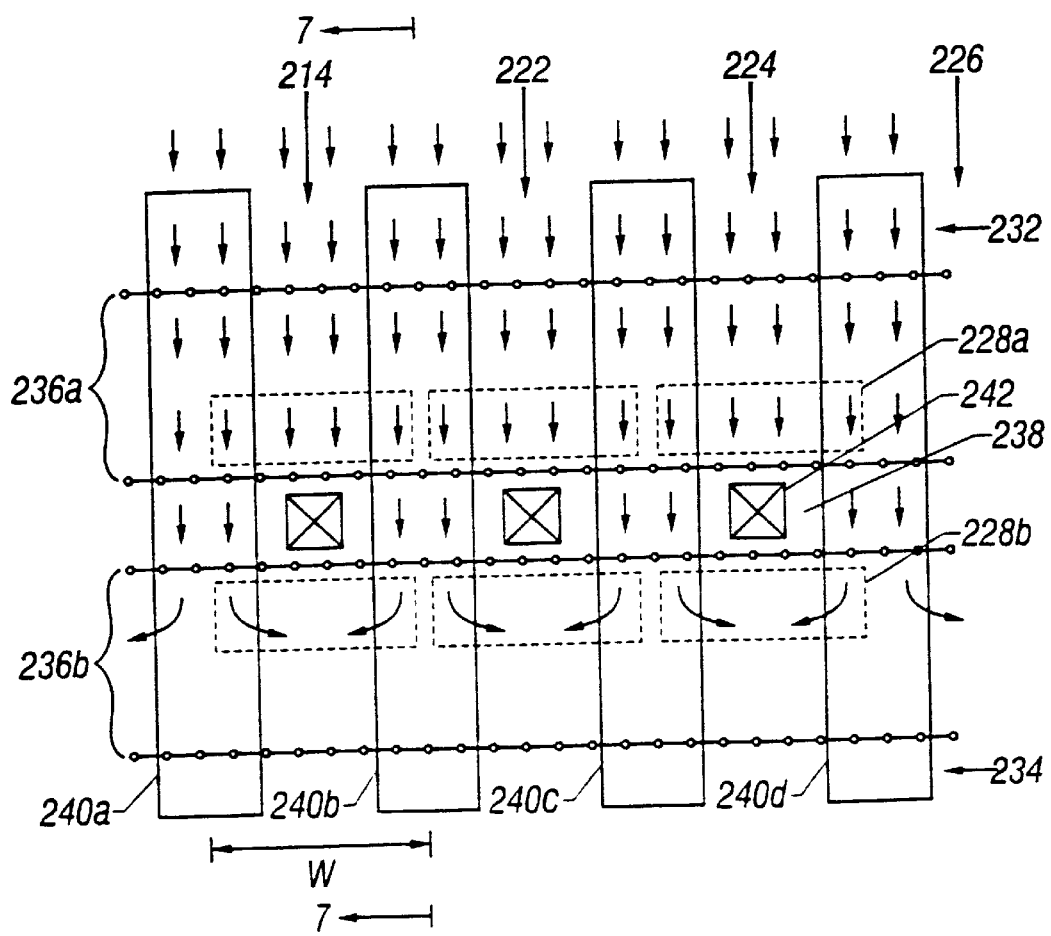
FIG. 8 is a greatly enlarged, top plan view showing the layout of a semiconductor implementation of the embodiment shown in FIG. 6.
Figure 9:
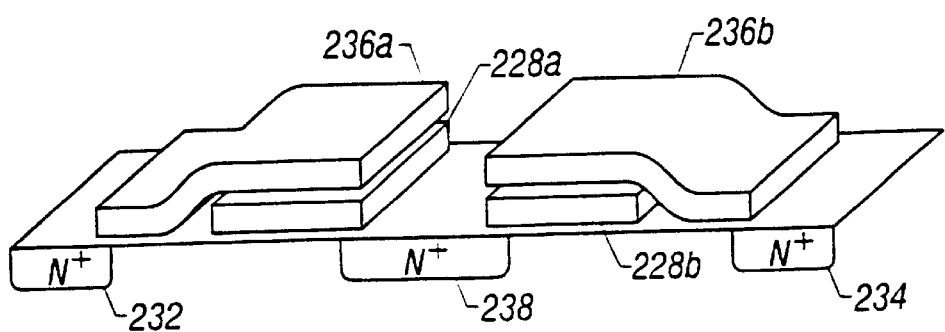
FIG. 9 is a partial three dimensional view of the cell shown in FIG. 8.

The physical relationship of the cells 210, 216, 218 and 220 is illustrated in FIG. 8. The floating gates 228 are shown in dashed lines. Similarly, the control gates 236 span between the drain 238 and a source 232 or 234. Drain contacts 242 are located between the control gates 236 and bit lines 214, 222, 224 and 226. Bit lines 214, 222, 224 and 226 extend transversely to the control gates 236.

The cell 210 may be described as a flash EEPROM utilizing high efficiency substrate hot electron injection for erasure and Fowler-Nordheim tunneling for programming.

The cells are erased by causing charge to accumulate on the floating gates 228 and programming is achieved when charge is removed from the floating gates. Thus, initially all of the cells have accumulated charges on their floating gates. All of the cells 210, 216, 218, and 220 are erased together using block erasing.

Erasing is achieved by high efficiency substrate hot carrier injection. As indicated in FIG. 7, substrate carriers such as the electrons, indicated by the arrows at 266, may be generated by forward biasing a source 232 or 234. That is, the source of one cell acts as the injector for the other cell of a pair of cells 210, 216, 218, or 220. Thus, the source 232 acts as an injector for the cell 210b being erased in FIG. 7. Similarly, the source 234 acts an injector for the cell 210a when the cell 210a is being erased.

The source 232 is separated from the cell 210b by the channels 264a and 258 and the drain 238. Some of the substrate electrons 266 diffuse through these regions to the channel region 256b underneath the cell 210b. Some electrons are ineffectively taken by the drain 238.

For cells that need to be erased, the channel region 256 may be biased such that a depletion region is formed. When an electron gets to the depletion region, it is accelerated by an electric field, Vcs. The electric field Vcs is the difference between the channel potential (potential of the surface inversion region) and the P-well 244 potential. Some of these electrons gain sufficient energy, in excess of the effective oxide barrier height potential, to be injected onto the floating gate 228b.

For cells that are not to be erased, the channel-to-P-well potential is less then the effective oxide barrier height. In such case, the electrons would not gain sufficient energy to overcome the barrier height and are not injected onto the floating gate 228.

Figure 10:
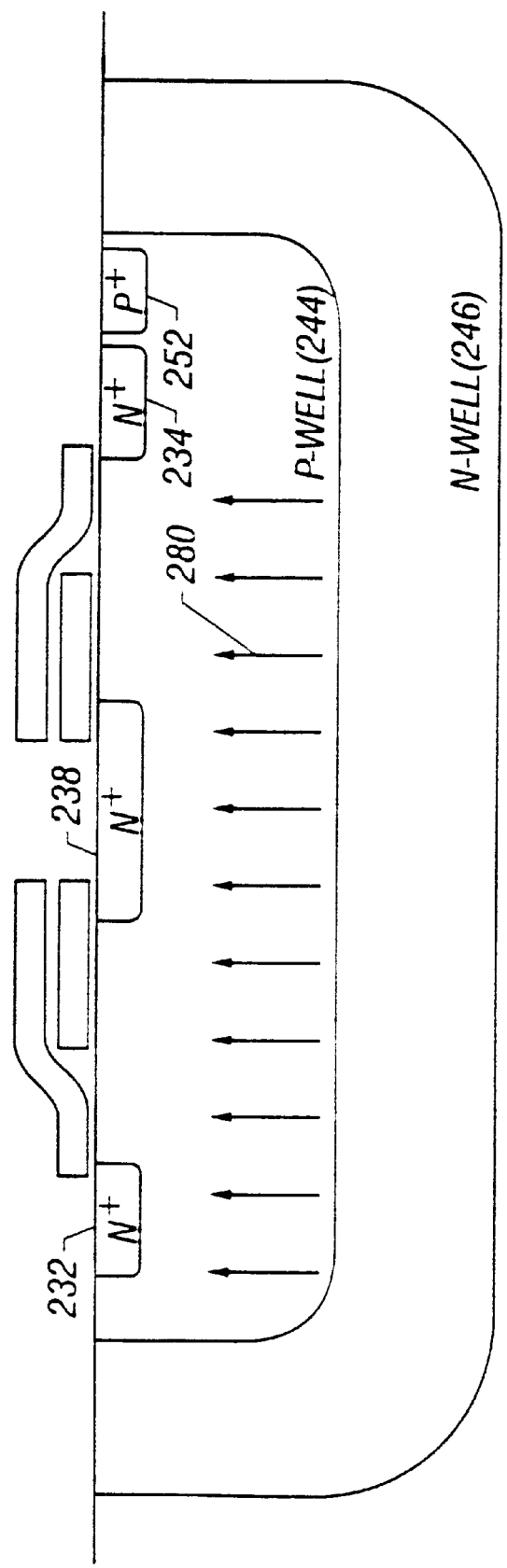
FIG. 10 is a cross-sectional view of another embodiment.

In the case when flash erase is desired, a scheme exits where all the cells inside the same P-well can be erased together. This is achieved by forward-biasing the P-well 244 with respect to the N-well 246. Electrons are injected from the bottom of the P-well 244 as indicated by the arrows 280, and are collected by either the floating gate or the drain as shown in FIG. 10.

The heavily doped N-type source 232, the P-type regions 264a and 256a under the cell 210a, the region under the drain 238 and the cell 210b channel 256b, form a lateral bipolar transistor 268. The emitter (source 232) of the bipolar transistor 268 acts as a charge injector, injecting substrate electrons from the source to the biased depletion region under the floating gate 228b. With the source 232 as the emitter and the channels 268a, 256a and the region under the drain 238 as the base, the collector is the biased depletion region 256b. A compact cell layout is achieved because separate select transistors are unnecessary and the drain 238 acts as the drain for two adjacent cells in a pair of cells. The source of one cell also acts as the efficient injector for the other cell of a pair.

The efficiency of substrate hot electron injection is a function of a number of characteristics. Considering the depletion region 256b, electrons scatter with lattice phono scattering across the depletion region with a certain electron mean free path. Some of these electrons, without much scattering, gain sufficient energy to overcome the effective barrier height and are injected onto the floating gate 228. Some electrons gain less energy than the effective barrier height and are not injected onto the floating gate 228. The injection efficiency is a strong function of the doping concentrations and the channel-to-P-well potential, Vcs.

Since the cell 210 is situated in a P-well 244 embedded in an N-well 246, during erasing the floating gate 2228 is capacitively coupled to a high voltage by raising the potential on the bit lines, which may be biased to a potential from 7 to 14 volts. The voltage that the floating gate 228 attains at low drain bias is approximately a function of the voltage on the floating gate when the control gate 236b and the P-well 244 and drain 238 are at ground, plus the coupling ration times the voltage on the control gate 236b. The coupling ratio, to a first order, is approximately equal to the capacitance of the coupling capacitor 261 divided by the sum of the capacitances of the coupling capacitor 261 and the tunneling capacitor 257.

When the cell 210a is off, the drain 238 potential can be forced close to the supply potential Vcc or higher. The channel 246b potential, which is the potential of the surface inversion region of the channel region, is set as follows. When the potential of the floating gate 228 (Vfg) is one cell threshold voltage higher than the drain 238 potential, the channel potential is the same as the drain potential. On the other hand, when the floating gate 228 potential is less than the drain 238 potential plus the cell threshold voltage, the channel potential is the difference between the floating gate 228 voltage and the cell threshold voltage.

The P-well potential is the voltage 250 applied to the P-well 244. The P-well 244 is embedded in an N-well 246, and the N-well is set at a voltage 254 of approximately Vss or higher, such as Vcc. Thus, the P-well potential can be Vss or negative, typically negative one to negative two volts. Moreover, P-well potential is usually less than the effective oxide barrier height to avoid any potential disturb problem.

The potential difference between the channel 246b region and the P-well 244 potential 250 is the voltage across the depletion region. For cells to be erased, the drain 238 voltage is raised high, typically close to Vcc or higher. A depletion region underneath the cell being erased is formed with a voltage drop equal to the channel potential minus the P-well potential 250.

For those cells that are not to be erased, the unselected word line voltage may be set to zero volts (Vss). The voltage drop across the depletion region then is less than the effective oxide barrier height.

Cell 210 programming is achieved by Fowler-Nordheim tunneling of electrons from the floating gate 228 to the channel region 256b and the drain 238. During programming, the selected bit line 236b is forced to a high voltage "H" (higher than Vcc) of about 5 volts, for example. The unselected bit lines are maintained at Vss. If the N-well and P-well are maintained at Vcc and Vss respectively, the electric field across the junction between the drain 238 and the P-well 244 may be reduced. The reduced field prevents acceleration of hot hole trapping in the gate oxide under the floating gate 228.

Electrons tunnel to the drain 238 (drain programming). The tunneling current depends on the voltage from the floating gate 228 to the drain 238. Reading the programming state of a cell may be accomplished as follows. The selected bit line is biased to approximately 0.7 to one volt. The rest of the bit lines are allowed to float. The source 232 may be biased to $-V_S$ and the source 234 may be biased to $V_H$. The selected word line is biased to $V_{HH}$ and the adjacent word line is biased to $-V_S$. The P-well is biased to Vss and the N-well is biased at Vcc. Vs is the node voltage set by the injection current level, ranging, from a few tens of nano-amps to a few tens of microamps depending on the programming speed requirement. Typically it would be from tens of milliseconds to tens of microseconds. Vss is the external ground potential.

When these potentials are applied to the selected cell 210, a current flows through the cell. This current is then fed to a current sense amplifier (not shown). If the voltage on the floating gate 228 is greater than the threshold voltage on the sense transistor 212, a higher current, perhaps greater than 20 microamps, is detected as the conducting state. When the potential of the floating gate is less than the threshold voltage, a lower current, for example, less than one micro-amp flows, and a nonconducting state is detected.

The source 232 is biased to $-V_S$ (i.e., a diode voltage drop, approximately 0.7 volts, for example) while the source 234 is at $V_{HH}$. $V_{HH}$ may be from about 10 to 14 volts in one embodiment. The selected word line is biased to $V_{HH}$ and the adjacent word line of the pair is $-V_S$. The P-well bias is $-V_{ss}$ and the N-well bias is Vcc.

The voltage across the capacitor 257 is the difference between the floating gate 228 potential on the one hand and the drain 238 and the P-well 244 potentials. When the difference exceeds 8 to 10 volts, sufficient tunneling current is generated and the floating gate 228 can be erased to a negative potential in the time frame of a few milliseconds to a few seconds, depending on the tunneling oxide 56 thickness.

A detected conducting state can be called a one state. A nonconducting state can be called the zero state.

A suitable on-chip circuit for generating two negative bias potentials, one to bias a word line 236 and the other to negatively bias the P-well 244, can be found in L. A. Glasser and D. W. Dobberpuhl, "The Design and Analysis of VLSI Circuits," (December 1985), published by Addison-Wesley, at pages 301–329, hereby expressly incorporated by reference herein.

The cells in the array may be formed using conventional process technologies such as double poly, single metal CMOS process. The illustrative parameters set forth herein contemplate a 0.25 microns or lower feature size with Vcc potentials of 1.8 volts. As the technology permits lowering voltages and smaller feature sizes, the parameters herein would scale accordingly.

Referring again to FIG. 7, the flow of electron current from the injector, which in the illustrated embodiment is the source 232, to a floating gate 228b is shown. The substrate electrons, indicated by arrows, may flow from the source 232 along the entire width "W" of the cell between adjacent isolation regions 240. In addition, electrons flow from the portions 232a and 232b extending beyond the cell width. Namely, the portions of the source 232 extending to either side of the cell in the width direction also contribute electrons which may be utilized to program the floating gate 228. This may significantly increase the available electron current for erasing and thus may expedite erasing.

This arrangement is possible because the heavily doped N-type sources 232 and 234 run parallel to the control gates 236. In other words, the sources 232 and 234 run parallel to the word lines or rows of the array. Because of this geometry, a portion of the source which is greater in length than the width of the cell may be utilized for erasing purposes. Namely, additional electrons may flow from the extensions 210a and 210b between the adjacent columns of cells.

The operation of one embodiment of the invention is illustrated in the following mode table:

10–20 ohm-cm. The P-wells 28 and 244 are embedded in N-wells 29 and 246 in the so-called triple well process. The P-wells 28 and 244 has a typical well depth of, for example, 4–8 $\mu$m. The doping concentration may be from $4 \times 10^{15}$ to $1 \times 10^{16}$ atoms per cubic centimeter. The triple well is formed by the P-wells 28 and 244 counterdoping the N-wells 29 and 246.

The formation of the elements in the triple well is as follows. An N-well implant is done, for example, with phosphorus 31 with a typical dose of 1 to $1.5 \times 10^{13}$ atoms per square centimeter and an energy of 160 to 100Kev. The N-well implant is driven using a high temperature step which may typically be 6 to 12 hours at 1125 to 1150° C. The N-wells 29 and 256 are then counterdoped with a P-well implant. Typical dosages for the P-well implant could be 1.5 to $2.5 \times 10^{13}$ atoms per square centimeter with an energy of 30Kev to 180Kev using a species such as boron 11. The N-wells 29 and 246 and P-wells 28 and 244 are then driven, typically 6 to 10 hours at 1125 to 1150° C. This sets the wells to the desired doping concentrations and depths.

After the well formation, standard logic field oxide formation and channel stop formation steps are applied. The field oxide thickness and implant doses are adjusted to achieve a field threshold of 7 to 14 volts, which is determined by the Vpp level for programming and erasing and by logic process capability. After this formation, a memory cell implant may be performed. For example, a B11 implant at 30 to 50Kev with a dose of 1.5 to $3 \times 10^{13}$ atoms per square centimeter may be done through sacrificial oxide. The select transistor gate oxide 52 and the tunnel oxides 30 and 256 are then formed. For example, an 85 to 100 Angstrom dry oxide may be grown across the wafer. A dry oxide is grown, for example, at 900° C. in partial oxygen followed by a 975 to 1050° C. anneal.

The floating gates 22 and 228 may then be formed of polysilicon, silicide or metals. If polysilicon is used, it can be 1600 Angstroms thick, and POCL3 doped at 870 to 1000° C. The interpoly dielectric is formed of an oxide-nitride-

|  | Selected B/L | Unselected B/L | Source 1 | Source 2 | Next to Selected WL | Selected WL |
|---|---|---|---|---|---|---|
| Erase | H | H | $-V_S$ | $V_H$ | $-V_S$ | $V_{HH}$ |
| Prog. | H | Vss | Float | Float | Vss | $-V_{HH}$ |
| Read | .7–1.0 V | Float | Vss | Vss | Vss | Vcc |
| Flash Erase | H | H | $-V_S$ | $-V_S$ | $V_{HH}$ | $V_{HH}$ |

The cells in the array may be formed using conventional process technologies such as a double poly, single metal CMOS process. The illustrative parameters set forth herein contemplate a 0.25 $\mu$m or lower feature size with Vcc potentials of 1.8 volts. As the technology permits lowering voltages and smaller feature sizes, the parameters herein would scale accordingly.

In one advantageous embodiment of the present invention, the FLASH and EEPROM memories are created with substantially the same process steps. By reducing the number of additional process steps, the cost of the overall device may be dramatically effected. In some embodiments, exactly the same process steps may be utilized for both memories so that no extra steps and no extra masking steps are necessary to obtain both memories on a single die.

The starting substrate material is typically P-type (100) silicon, for example having a resistivity in the range of oxide sandwich (ONO) with the lower oxide being from 60 to 80 Angstroms, the nitride layer having a thickness of from 90 to 180 Angstroms and the upper oxide being from 30 to 40 Angstroms. A 125 to 200 Angstrom gate oxide may be grown for the oxide under the capacitor 50.

After floating gate and select gate definition, a N+ implant is implanted into the source of the select transistors 14 and 210 and the drain of the sense transistors 12 and 210. It is blocked between the two gates so that it does not enter the region under the plate of the capacitor 50, the N+ implant can be, for example, a phosphorus implant at 60Kev, at a dose of 1 to $3 \times 10^{14}$ atoms per square centimeter may be followed by arsenic at 60Kev, 2.5 to $4.5 \times 10^{15}$ atoms per square centimeter. It is also possible to form the source and drain using lightly doped drain (LDD) technology.

The polysilicon (poly 2) for the control gate may then be deposited and silicided if desired. The gates are patterned and defined using standard techniques. The control gate is not self-aligned to the sense and select gates.

With the completion of these capacitor and transistor structures, all subsequent processing for contacts and interconnect layers follows standard logic rear end processing.

While a number of parameters and levels are provided in the foregoing description, those skilled in the art will appreciate that these parameters and levels are merely for illustration purposes. For example, by reversing the conductivity types of the doped junctions and the bias polarities, a cell structure using substrate hot hole injection may be implemented. It is intended that the appended claims cover all modifications and variations as fall within the true spirit and scope of the present invention.

What is claimed is:

1. A method of forming an integrated circuit die comprising:

forming a first portion including logic circuits;

forming a second portion including EEPROM memory;

forming a third portion including a FLASH memory using substrate hot electron injection to inject charge onto the floating gate of the memory; and using substantially the same process steps to form said second and third portions.

2. The method of claim 1 including using substantially the same process steps to form said first, second and third portions.

3. The method of claim 1 including using exactly the same process steps to form said second and third portions.

4. The method of claim 3 including using exactly the same process steps to form said first, second and third portions.

5. A method of forming an integrated circuit die comprising:

forming an EEPROM memory on said die;

forming a FLASH memory on said die using substrate hot electron injection to inject charge onto the floating gate of said FLASH memory; and using substantially the same process steps to form said EEPROM and FLASH memories.

6. The method of claim 5 including using exactly the same process steps to form said EEPROM and FLASH memories.

7. The method of claim 5 including using byte erasing with said EEPROM memory.

8. The method of claim 5 including using block erasing with said FLASH memory.

9. The method of claim 5 further including forming said EEPROM and FLASH memories such that the cells of said FLASH memories are smaller than the cells of said EEPROM memory.

* * * * *